United States Patent
Senior et al.

(10) Patent No.: US 9,998,143 B2
(45) Date of Patent: Jun. 12, 2018

(54) SYSTEM, APPARATUS, AND METHOD FOR DECOMPRESSING DATA

(71) Applicant: QUALCOMM Incorporated, San Diego, CA (US)

(72) Inventors: Richard Senior, San Diego, CA (US); Amin Ansari, San Diego, CA (US); Jinxia Bai, San Diego, CA (US); Vito Bica, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/230,325

(22) Filed: Aug. 5, 2016

(65) Prior Publication Data
US 2016/0344406 A1 Nov. 24, 2016

Related U.S. Application Data

(63) Continuation of application No. 14/626,905, filed on Feb. 19, 2015, now Pat. No. 9,413,386.

(51) Int. Cl.
*H03M 7/30* (2006.01)
(52) U.S. Cl.
CPC .......... *H03M 7/3088* (2013.01); *H03M 7/30* (2013.01); *H03M 7/3086* (2013.01); *H03M 7/6005* (2013.01)
(58) Field of Classification Search
None
See application file for complete search history.

(56) References Cited

U.S. PATENT DOCUMENTS

| | | | |
|---|---|---|---|
| 5,951,623 A | 9/1999 | Reynar et al. | |
| 6,683,547 B2 * | 1/2004 | Border | H03M 7/3088 341/106 |
| 6,903,668 B1 | 6/2005 | Dror et al. | |
| 7,898,442 B1 | 3/2011 | Sovik | |
| 8,126,855 B2 | 2/2012 | Faerber et al. | |
| 8,352,605 B2 | 1/2013 | Samuels et al. | |
| 8,595,268 B2 | 11/2013 | Shoolman et al. | |
| 8,633,838 B2 | 1/2014 | Falls et al. | |
| 8,665,124 B2 | 3/2014 | Pardo et al. | |
| 8,766,827 B1 | 7/2014 | Milne et al. | |
| 9,413,386 B1 | 8/2016 | Senior et al. | |
| 9,419,648 B1 * | 8/2016 | Guilford | H03M 7/40 |
| 2008/0120315 A1 | 5/2008 | Ionescu et al. | |

OTHER PUBLICATIONS

"Linux Standard Base Specification 3.1", copyright 2005, Internet URL: https://refspecs.linuxbase.org/LSB_3.1.0/LSB-generic/LSB-generic/zlib-inflate-1.html.

* cited by examiner

*Primary Examiner* — Howard Williams
(74) *Attorney, Agent, or Firm* — Muncy, Geissler, Olds & Lowe, P.C./QUALCOMM

(57) ABSTRACT

A system for data decompression may include a processor coupled to a remote memory having a remote dictionary stored thereon and coupled to a decompression logic having a local memory with a local dictionary. The processor may decompress data during execution by accessing the local dictionary, and if necessary, the remote dictionary.

20 Claims, 5 Drawing Sheets

SYSTEM, APPARATUS, AND METHOD FOR DECOMPRESSING DATA

CLAIM OF PRIORITY UNDER 35 U.S.C. § 120

The present Application for Patent is a continuation of, and claims priority to, U.S. patent application Ser. No. 14/626,905, entitled "SYSTEM, APPARATUS, AND METHOD FOR DECOMPRESSING DATA," filed Feb. 19, 2015, pending, assigned to the assignee hereof, and expressly incorporated herein by reference in its entirety.

FIELD OF DISCLOSURE

This disclosure relates generally to data decompression, and more specifically to data decompression using pre-fetch hints.

BACKGROUND

Memory is one of the key driving factors in embedded system design since a larger memory indicates an increased chip area, more power dissipation, and higher cost. As a result, memory imposes constraints on the size of the application programs. Code compression techniques address the problem by reducing the program size. Dictionary-based code compression techniques are popular because they offer both a good compression ratio and fast decompression. A conventional code compression and decompression flow involves compression of the data prior to execution, and the compressed data is stored in memory. At execution time, the processor will fetch blocks of compressed data from memory and process those blocks through a decompression process during run time.

Conventionally, data decompression in a system requires a decompression engine or mechanism, a processor, and memory. The memory may be on-chip (but this translates into substantially higher hardware cost) or it may be off-chip (but translates into a high-latency). Since the chip area required for memory is very large, the memory is typically located remote from the processor to save processor chip area. A conventional decompression engine uses a mix of techniques to decompress, such as dictionaries containing the most frequently occurring words, references to previously decoded words ("LookBack"), and encoding uncompressible words directly. However, the decompression engine must access the memory for most of these operations. The latency to access remote memory is typically high. For example, the latency to send a request to access memory and return the data from the accessed memory location can take 60 clock cycles. Thus, conventional data decompression suffers from memory access latency that increases the total time required to decode a data block.

Accordingly, there is a need for systems, apparatus, and methods that improve upon conventional data decompression by reducing the memory access latency including the improved systems, methods, and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some aspects of the disclosure are directed to systems, apparatus, and methods for data decompression that may include a processor; a remote memory having compressed data and decode codes stored therein, the remote memory coupled to the processor; an input buffer coupled to the processor and the remote memory, the input buffer configured to temporarily store compressed data from the remote memory; an output buffer coupled to the processor and the remote memory, the output buffer configured to temporarily store decompressed data; and a decompression logic configured to decompress the compressed data in accordance with the decode codes, the decompression logic being coupled to the input buffer and the output buffer.

In some aspects of the disclosure, the system, apparatus, and method includes sending a decompression request to a decompression logic; sending, by the decompression logic, an index data request to a remote memory in response the decompression request; inputting compressed data from the remote memory to an input buffer in response to the decompression request; decompressing, by the decompression logic, a first portion of the compressed data; inputting index data from the remote memory to the decompression logic; and decompressing, by the decompression logic, a second portion of the compressed data by using the index data to access decompressed data stored in a dictionary.

Some aspects of the disclosure are directed to a non-transitory computer-readable storage medium having instructions that, when executed by a processor, cause the processor to: send a decompression request to a decompression logic; send, by the decompression logic, an index data request to a remote memory in response the decompression request; input compressed data from the remote memory to an input buffer in response to the decompression request; decompress, by the decompression logic, a first portion of the compressed data; input index data from the remote memory to the decompression logic; and decompress, by the decompression logic, a second portion of the compressed data by using the index data to access decompressed data stored in a dictionary.

Other features and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of examples of the disclosure and are provided solely for illustration of the examples and not limitation thereof.

A more complete appreciation of aspects of the disclosure and many of the attendant advantages thereof will be readily obtained as the same becomes better understood by reference to the following detailed description when considered

Figure 1:
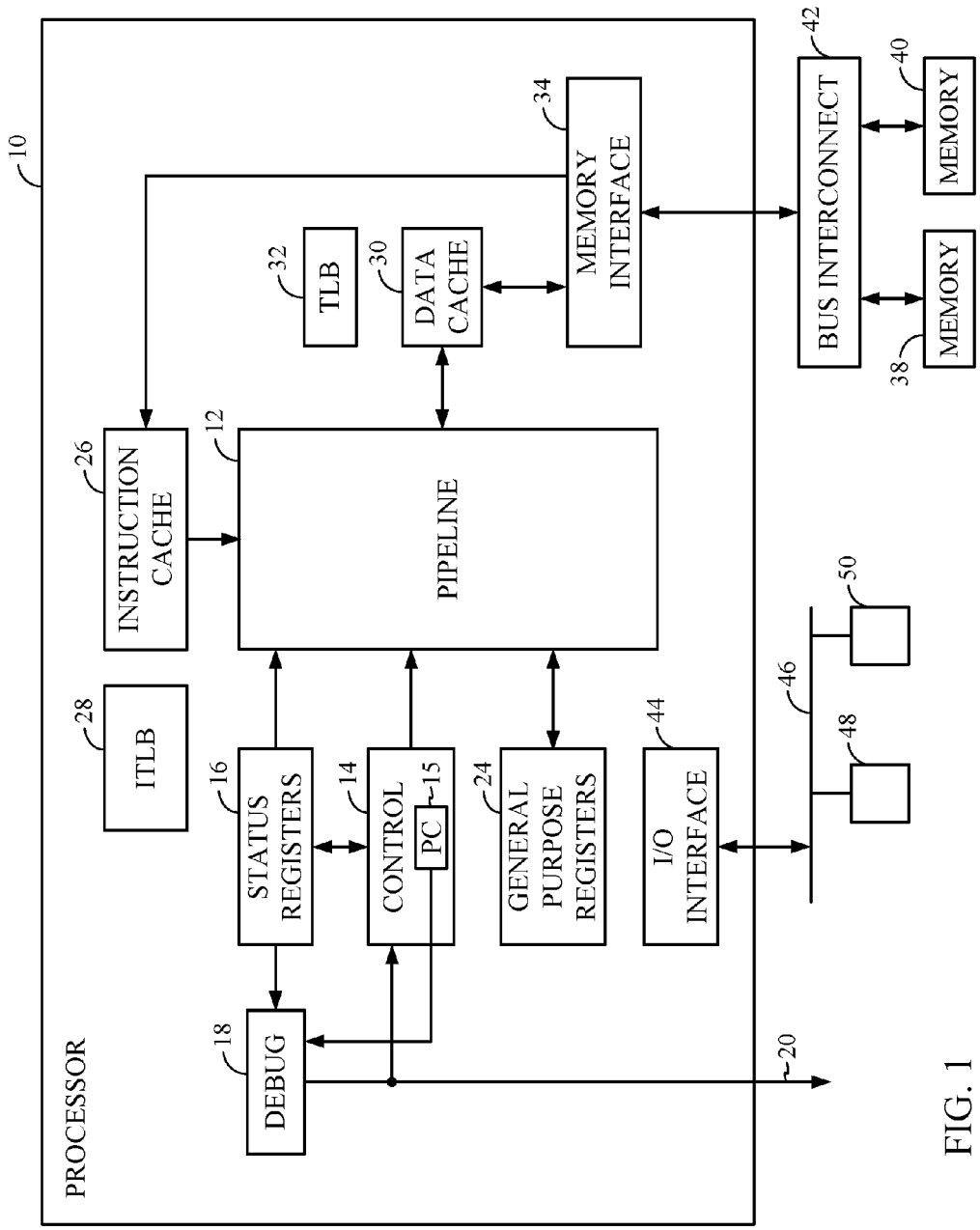
FIG. 1 illustrates an exemplary processor in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus and systems for are provided. The exemplary methods, apparatus, and systems disclosed herein advantageously address the industry needs, as well as other previously unidentified needs, and mitigate shortcomings of the conventional methods, apparatus, and systems. For example, an advantage provided by the disclosed methods, apparatus, and systems herein is an improvement in data decompression latency.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

FIG. 1 depicts a functional block diagram of an exemplary processor 10 configured to incorporate features of the data decompression. Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some examples, pipeline 12 may be a superscalar design, with multiple, parallel pipelines. Pipeline 12 may also be referred to as an execution unit. A General Purpose Register (GPR) file provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two. Debug circuit 18 is described in greater detail below.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various examples, ITLB 28 may comprise a copy of part of TLB 32. Alternatively, ITLB 28 and TLB 32 may be integrated. Similarly, in various examples of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master device coupled to a bus interconnect 42 implementing a shared bus to one or more memory devices 38, 40 that may incorporate the data decompression in accordance with some examples of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular example. Other functional blocks that may reside in processor 10, such as a JTAG controller, instruction pre-decoder, branch target address cache, and the like are not germane to a description of the present disclosure, and are omitted for clarity.

Figure 2:
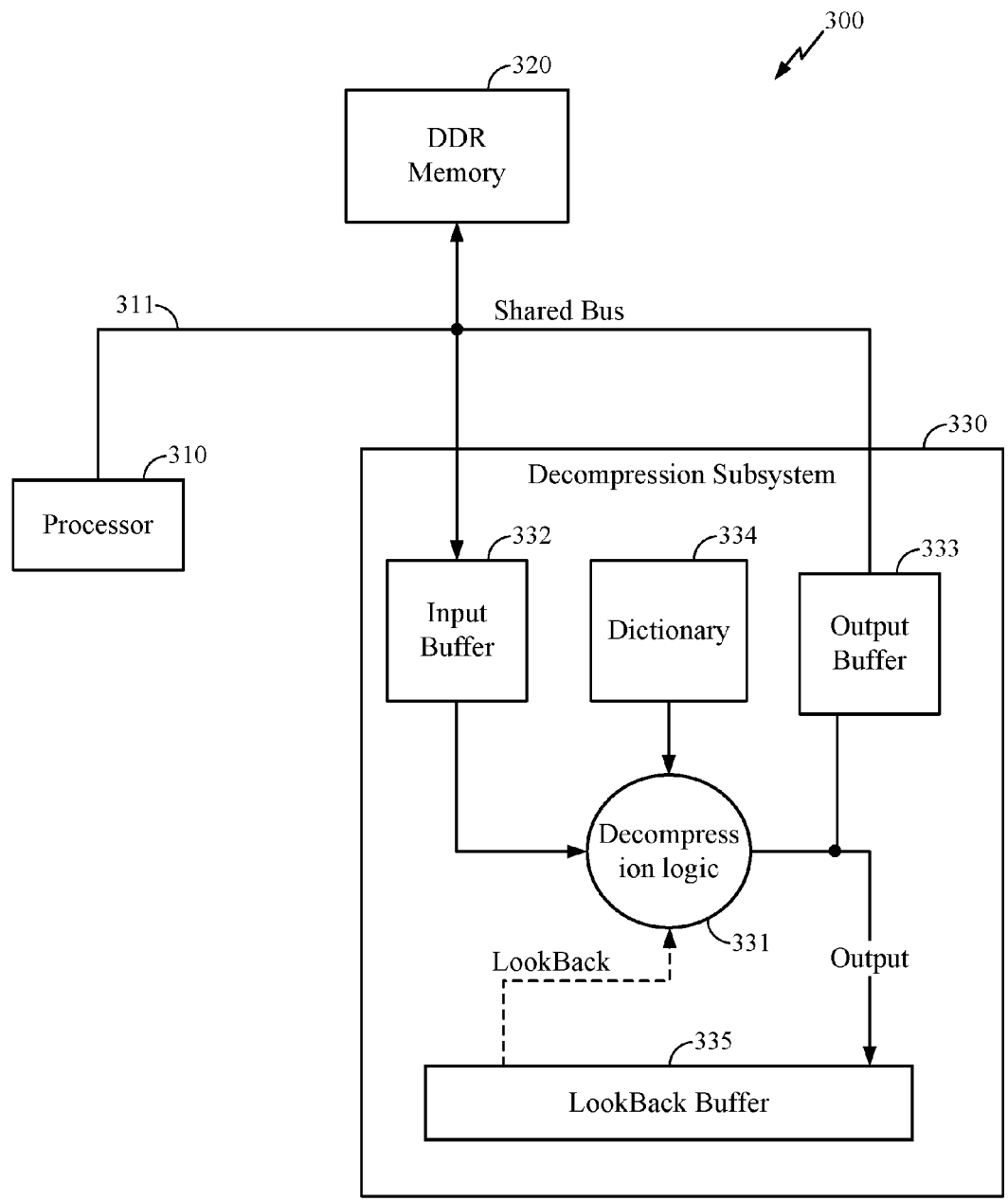
FIG. 2 illustrates an exemplary data decompression system with a local dictionary in accordance with some examples of the disclosure.

FIG. 2 illustrates an exemplary data decompression system with a local dictionary in accordance with some examples of the disclosure. As shown in FIG. 2, a system 300 may include a processor 310, a remote memory 320, and a decompression component 330. The processor 310 may be coupled to the remote memory 320 and the decompression component 330 through a shared bus 311. The shared bus 311 allows the processor 310 to communicate with the remote memory 320 and the decompression component 330. The remote memory may have compressed data stored therein. The compressed data may have a mix of raw, uncompressed data as well as compressed data.

The decompression component 330 may include a decompression logic 331, an input buffer 332, an output buffer 333, a dictionary 334, and a lookback buffer 335. The dictionary 334 may include a first dictionary stored therein having dictionary entries that represent compressed data. The dictionary entries are stored at locations specified by dictionary index values. The lookback buffer 335 may include a first lookback dictionary stored therein having lookback index entries that represent previously decoded data stored at locations specified by lookback index values. The input buffer 332, output buffer 333, dictionary 334, and lookback buffer 335 may be memory that is local to the decompression logic 331, such as a processor cache.

The operation of system 300 according to some examples of the disclosure will now be discussed. When the processor begins processing or running an application, the processor sends a request to the remote memory 320 to fetch a first data block of compressed data and associated decode code. The decode codes indicate how the associated compressed data should be decoded (uncompressed). The first data block may be of any size but is conventionally about 2K of compressed data and decode code that is streamed into the input buffer 332. The first data block is input into the input buffer 332. The decompression logic 331 then begins processing the first data block in the input buffer 332 on a per clock cycle basis according to the decode code received with the compressed data. In the first clock cycle (decode 0), the decompression logic 331 inputs compressed data and the associated decode code. The decode code may indicate how the decompression logic 331 should decode the compressed data and may be stored with the compressed data in the remote memory 320. Examples of types of decode codes are as follows: The decode code may indicate that the compressed data is raw compressed data (raw code—no lookback or dictionary entry currently corresponds to the compressed code), the compressed data corresponds to a dictionary entry (dictionary code), or the compressed data corresponds to a lookback entry (lookback code). The compressed data may be of any size but is preferably 32 bits.

The initial decode code is conventionally a raw code that indicates the data decompression should be done without any access to the lookback buffer 335, but may be a dictionary code. If the initial decode code indicates it is raw code, the decompression logic 331 begins decompression by using a decompression technique to decompress the compressed data. The decompression logic 331 then stores or streams the decompressed data to the output buffer 333 and stores the decompressed data in the lookback buffer 335 at a first lookback location. A first lookback index value is then set to indicate the first lookback location of the decompressed data. As subsequent compressed data with a raw code indication is decompressed, the decompression logic 331 stores the decompressed data in the lookback buffer 335 at a second (or subsequent) lookback location and sets a second lookback index value to indicate the second lookback location in the lookback buffer 335.

When the initial decode code received is the dictionary code, the decompression logic 331 begins decompression by accessing the dictionary 334 at a location specified by the dictionary index value for any matches. If matches for the compressed data are located in the dictionary 334, the compressed data is replaced by the uncompressed data in the dictionary 334 and stored or streamed to the output buffer 333. From the output buffer 333, the uncompressed data may be sent directly to the processor 310 or stored as uncompressed data in the remote memory 320.

In the next and subsequent decode cycles, the decompression logic 331 inputs another block of compressed data and decode code from the input buffer 332. If, for example, in a subsequent decode cycle the decode code is a lookback code with a lookback index value, the decompression logic 331 begins decompression by accessing the lookback buffer 335 at the location specified by the lookback index value. The compressed data is replaced by the uncompressed data at the location specified and stored or streamed to the output buffer 333. The decompression process then continues as outlined above until all the compressed data is decompressed (i.e. additional decode cycles are run wherein additional blocks of compressed data and associated decode code are retrieved.

Figure 3:
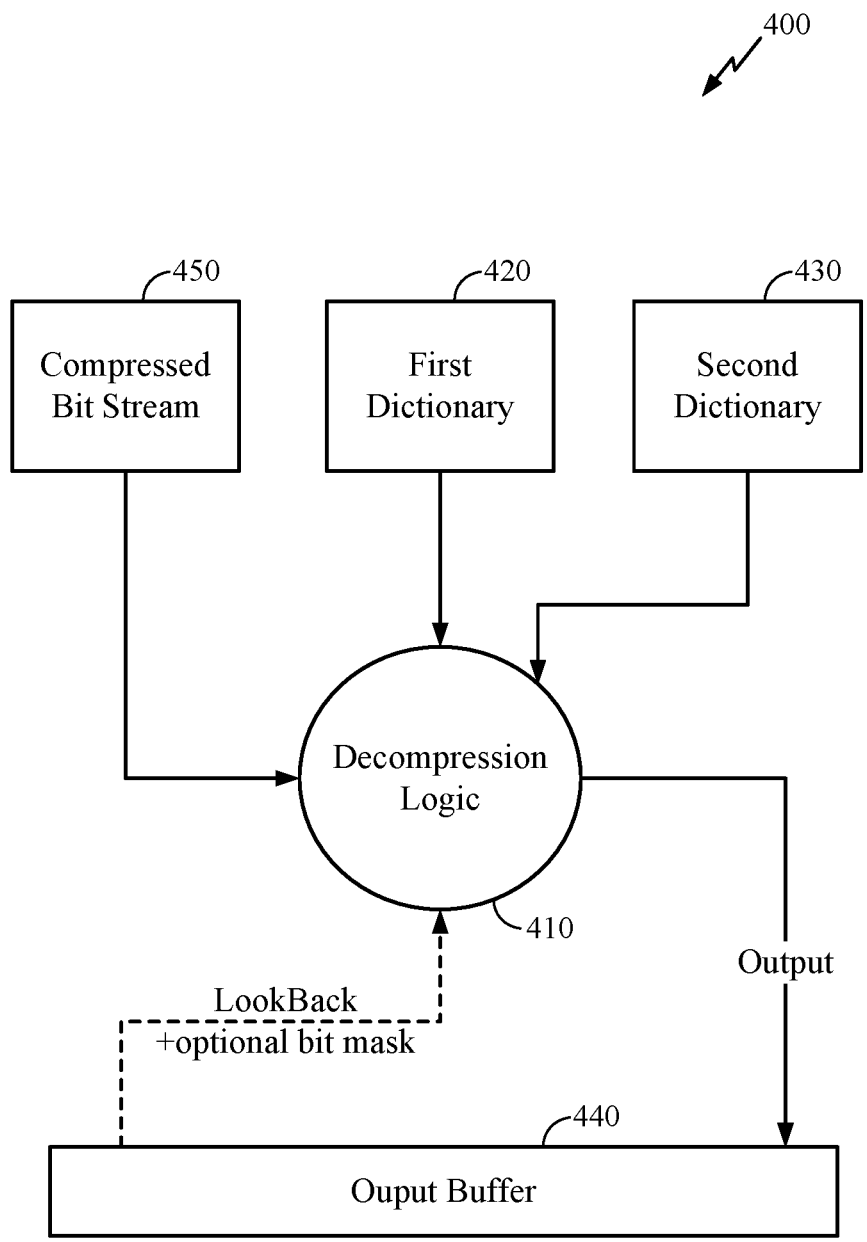
FIG. 3 illustrates an exemplary data decompression system with a first dictionary and a second dictionary in accordance with some examples of the disclosure.

FIG. 3 illustrates an exemplary data decompression system with a first dictionary and a second dictionary in accordance with some examples of the disclosure. The example shown in FIG. 3 is an alternative with two dictionaries as opposed to the example shown in FIG. 2 that has a single local dictionary. As shown in FIG. 3, a decompression system 400 may include a decompression logic 410, a first dictionary 420, a second dictionary 430, and an output buffer 440. The first dictionary 420 may be smaller than the second dictionary 430, for example the first dictionary 420 may hold 1024 words and the second dictionary 430 may hold 4096 words. The output buffer 440 may also act as a lookback buffer similar to lookback buffer 335 described above as well an output buffer similar to output buffer 333 described above. The decompression logic 410 may be coupled to the first dictionary 420, the second dictionary 430, and the output buffer 440. The first dictionary 420 may be reserved for building a dynamic dictionary and used to store previously decompressed data. The second dictionary 430 may be configured to store decompressed data that represents commonly compressed data. The commonly compressed data is stored at various locations specified by dictionary index values or pointers. The output buffer 440 may be configured as a temporary storage of decompressed data before being output from the decompression system 400.

One example of the operation of the decompression system 400 will now be discussed. Compressed data 450 is streamed or loaded into the decompression logic 410. The compressed data 450 may include a decode code and compressed data. Blocks of compressed data are sequentially streamed or clocked through the decompression logic 410. As each block is input into the decompression logic 410 on a per clock cycle basis, the decompression logic 410 looks at each block for a decode code (raw, dictionary, or lookback) and an index value or raw compressed code. The compressed data blocks may be of any size but are preferably about 32 bits of compressed raw data or index value along with a decode code. In the first clock cycle (decode 0), the decompression logic 410 inputs compressed data and a decode code. The decode code may indicate how the decompression logic 410 should decode the compressed data. The decode code may indicate that the compressed data is raw compressed data (raw code—no lookback or dictionary entry currently corresponds to the compressed code), the compressed data corresponds to a dictionary entry (dictionary code), or the compressed data corresponds to a lookback entry (lookback code).

The initial decode code is typically a raw code that indicates the data decompression should be done without any access to either the first dictionary 420 or the second dictionary 430. Upon receiving the raw code and the compressed bits, the decompression logic 410 begins decompression by using a decompression technique to decompress the compressed data. The decompression logic 410 then stores or streams the decompressed data to the output buffer 440 and stores the decompressed data in the first dictionary 420 at a first lookback location to build a dynamic dictionary. A first lookback index value is then set to indicate the first lookback location of the decompressed data in the first dictionary 420. As subsequent compressed data with a raw code indication is decompressed, the decompression logic 410 stores the decompressed data in the first dictionary 420 at a second (or subsequent) lookback location and sets a second lookback index value to indicate the second lookback location in the first dictionary 420.

When the decode code is a dictionary code with a dictionary index value, the decompression logic 410 begins decompression by accessing the second dictionary 430 at a location specified by the dictionary index value for any matches. If matches for the compressed data are located in the second dictionary 430, the compressed data is replaced by the uncompressed data in the second dictionary 430 and stored or streamed to the output buffer 440. For the output 440, the uncompressed data may be sent directly to a processor (not shown) or stored as uncompressed data in a remote memory (not shown).

In the next and subsequent decode cycles, the decompression logic 410 inputs another block of compressed data and decode code. Upon receiving a lookback code and a lookback index value, the decompression logic 410 begins decompression by access the first dictionary 420 at the location specified by the lookback index value. The compressed data is replaced by the uncompressed data at the location specified and stored or streamed to the output buffer 440. The decompression process then continues as outlined above until all the compressed data is decompressed.

Figure 4:
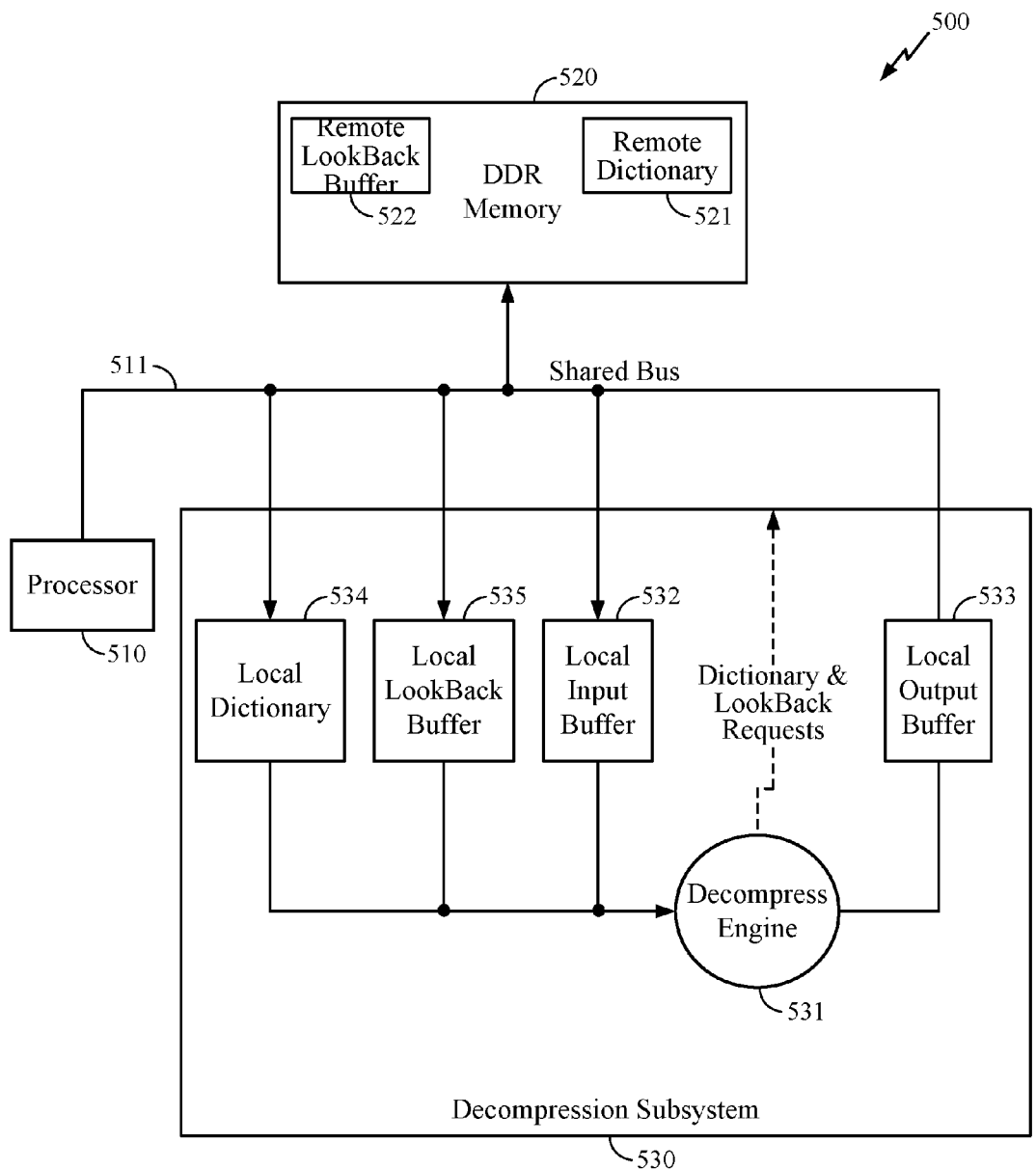
FIG. 4 illustrates an exemplary data decompression system with a local dictionary and a remote dictionary in accordance with some examples of the disclosure.

FIG. 4 illustrates an exemplary data decompression system with a local dictionary and a remote dictionary in accordance with some examples of the disclosure. As shown in FIG. 4, a system 500 may include a processor 510, a remote memory 520, and a decompression component 530. The processor 510 may be coupled to the remote memory 520 and the decompression component 530 through a shared bus 511. The shared bus 511 allows the processor 510 to communicate with the remote memory 520 and the decompression component 530. The remote memory 520 may have compressed data stored therein. The compressed data may have a mix of raw, uncompressed data as well as compressed data. The remote memory 520 may include a remote dictionary 521 and a remote lookback buffer 522.

The decompression component 530 may include a decompression logic 531, an input buffer 532, an output buffer 533, a local dictionary 534, and a local lookback buffer 535. The local dictionary 534 may include a first dictionary stored therein having dictionary entries that represent compressed data. The dictionary entries are stored at locations specified by dictionary index values. The local lookback buffer 535 may include a first lookback dictionary stored therein having lookback entries that represent previously decoded data at locations specified by lookback index values.

The operation of system 500 according to some examples of the disclosure will now be discussed wherein a cycle is one clock cycle of the processor and is enough time to process/decode a block of data (32 bits in this example). When the processor 510 begins processing or running an application, the processor 510 send a decompression request to the decompression component 530. The decompression logic 531 may then send an initial request to pre-load dictionary index values and lookback index values from the remote memory 520 (cycle 0-4).

Cycle 0: LookBack ("LB") Index0
Cycle 1: LB Index1
Cycle 2: Dictionary ("Dict") Index0
Cycle 3: Dict Index1

While four pre-load requests are described, the number of index values pre-loaded may vary based on the available local memory storage capacity as well as required latency criteria. Since the remote memory 520 is remote, it will take time (latency) for the request to be sent to the remote memory and data returned. This time varies based on the type of memory and access time of the memory. For example, it may take 60 cycles for a request for data to be processed by the remote memory 520.

While the pre-load requests are being processed by the remote memory 520, the decompression component 530 sends a request to the remote memory 520 to fetch a first data block of compressed data. First data block may be of any size but is preferably about 2K of compressed data that is streamed into the input buffer 532. The first data block is input into the input buffer 532. The decompression logic 531 then begins processing the first data block in the input buffer 532 on a per clock cycle basis. In the next clock cycle (cycle 4 in our example), the decompression logic 531 inputs compressed data and a decode code.

Cycle 4: Raw Code+32 bits

The decode code may indicate how the decompression logic 531 should decode the compressed data. The decode code may indicate that the compressed data is raw compressed data (raw code—no lookback or dictionary entry currently corresponds to the compressed code), the compressed data corresponds to a dictionary entry (dictionary code), or the compressed data corresponds to a lookback entry (lookback code). The compressed data may be of any size but is preferably 32 bits.

The initial decode code is typically a raw code that indicates the data decompression should be done without any access to the local dictionary 534 or the local lookback buffer 535, but may be a dictionary code. Upon receiving the raw code and the compressed 32 bits, the decompression logic 531 begins decompression by using a decompression technique to decompress the compressed data. The decompression logic 531 then stores or streams the decompressed data to the local output buffer 533 and stores the decompressed data in the local lookback buffer 535 at a new lookback location. A new lookback index value is then set to indicate the new lookback location of the decompressed data.

In the next clock cycle (cycle 5), the decompression logic 531 then begins processing the next data block in the input buffer 532 on a per clock cycle basis. In the next clock cycle, the decompression logic 531 inputs compressed data and a decode code.

Cycle 5: Raw Code+32 bits

The decode code is a raw code that indicates the data decompression should be done without any access to the local dictionary 534 or the lookback buffer 535. Upon receiving the raw code and the compressed 32 bits, the decompression logic 531 begins decompression by using a decompression technique to decompress the compressed data. The decompression logic 531 then stores or streams the decompressed data to the local output buffer 533 and stores the decompressed data in the local lookback buffer 535 at a new lookback location. A new lookback index value is then set to indicate the new lookback location of the decompressed data.

In the next clock cycle, the decompression logic 531 then begins processing the next data block in the input buffer 532 on a per clock cycle basis.

Cycle 6: Look Back Code+LB Index2

In this clock cycle, a lookback code is received and a new pre-load request is sent to fetch LB Index2. The decompression logic 531 accesses the lookback entry at the index value sent with the lookback code and sends the uncompressed data from that location to the local output buffer 533. The lookback entry may be in the local lookback buffer 535 or the remote lookback buffer 522. If the lookback index value of the Look Back code is not in the local lookback buffer 535, the system 500 must wait until the lookback index value is retrieved. This can take up to 60 cycles in our example, but may be less if a pre-load request for that index value has already been sent.

In the next clock cycle, the decompression logic 531 then begins processing the next data block in the input buffer 532 on a per clock cycle basis.

Cycle 7: Look Back Code+LB Index3

In this clock cycle, a lookback code is received and a new pre-load request is sent to fetch LB index3. The decompression logic 531 accesses the lookback entry at the index value sent with the lookback code and sends the uncompressed data from that location to the local output buffer 533. The lookback entry may be in the local lookback buffer 535 or the remote lookback buffer 522. If the lookback index value of the Look Back code is not in the local lookback buffer 535, the system 500 must wait until the lookback index value is retrieved. This can take up to 60 cycles in our example, but may be less if a pre-load request for that index value has already been sent.

In the next clock cycle, the decompression logic 531 then begins processing the next data block in the input buffer 532 on a per clock cycle basis.

Cycle 8: Dictionary Code+Dict Index2

Upon receiving the dictionary code, the dictionary index value for the dictionary code, and pre-load request for dict index2, the decompression logic 531 begins decompression by accessing the local dictionary 534 at a location specified by the dictionary index value for any matches. The decompression logic 531 also sends a pre-load request for dictionary index2. If matches for the compressed data are located in the local dictionary 534, the compressed data is replaced by the uncompressed data in the local dictionary and stored or streamed to the output buffer 533. For the output buffer 533, the uncompressed data may be sent directly to the processor 510 or stored as uncompressed data in the remote memory 520. If the dictionary index value of the dictionary code is not in the local dictionary 534, the system 500 must wait until the dictionary index value is retrieved, such as from the remote dictionary 521. This can take up to 60 cycles in our example, but may be less if the pre-load request for that index value has already been sent.

In the next clock cycle, the decompression logic 531 then begins processing the next data block in the input buffer 532 on a per clock cycle basis.

Cycle 9: Dictionary Code+Dict Index3

Upon receiving the dictionary code, the dictionary index value for the dictionary code, and pre-load request for dict index3, the decompression logic 531 begins decompression by accessing the local dictionary 534 at a location specified by the dictionary index value for any matches. The decompression logic 531 also sends a pre-load request for dictionary index3. If matches for the compressed data are located in the local dictionary 534, the compressed data is replaced by the uncompressed data in the local dictionary and stored or streamed to the output buffer 533. For the output buffer 533, the uncompressed data may be sent directly to the processor 510 or stored as uncompressed data in the remote memory 520. If the dictionary index value of the dictionary code is not in the local dictionary 534, the system 500 must wait until the dictionary index value is retrieved, such as from the remote dictionary 521. This can take up to 60 cycles in our example, but may be less if the pre-load request for that index value has already been sent.

In the next and subsequent decode cycles, the decompression logic 531 inputs another block of compressed data and decode code from the input buffer 532. The decompression process then continues as outlined above until all the compressed data is decompressed.

The local dictionary 534 and the local lookback buffer 535 may be pre-loaded with dictionary and lookback data, partially loaded, or empty and loaded during operation. By having local memory as opposed to remote memory, the decompression time may be lowered by avoiding some of the latency associated with the time to request and receive data from the remote memory. The size of the local memory can be adjusted based on available chip area and the processor caches may also be used.

Figure 5:
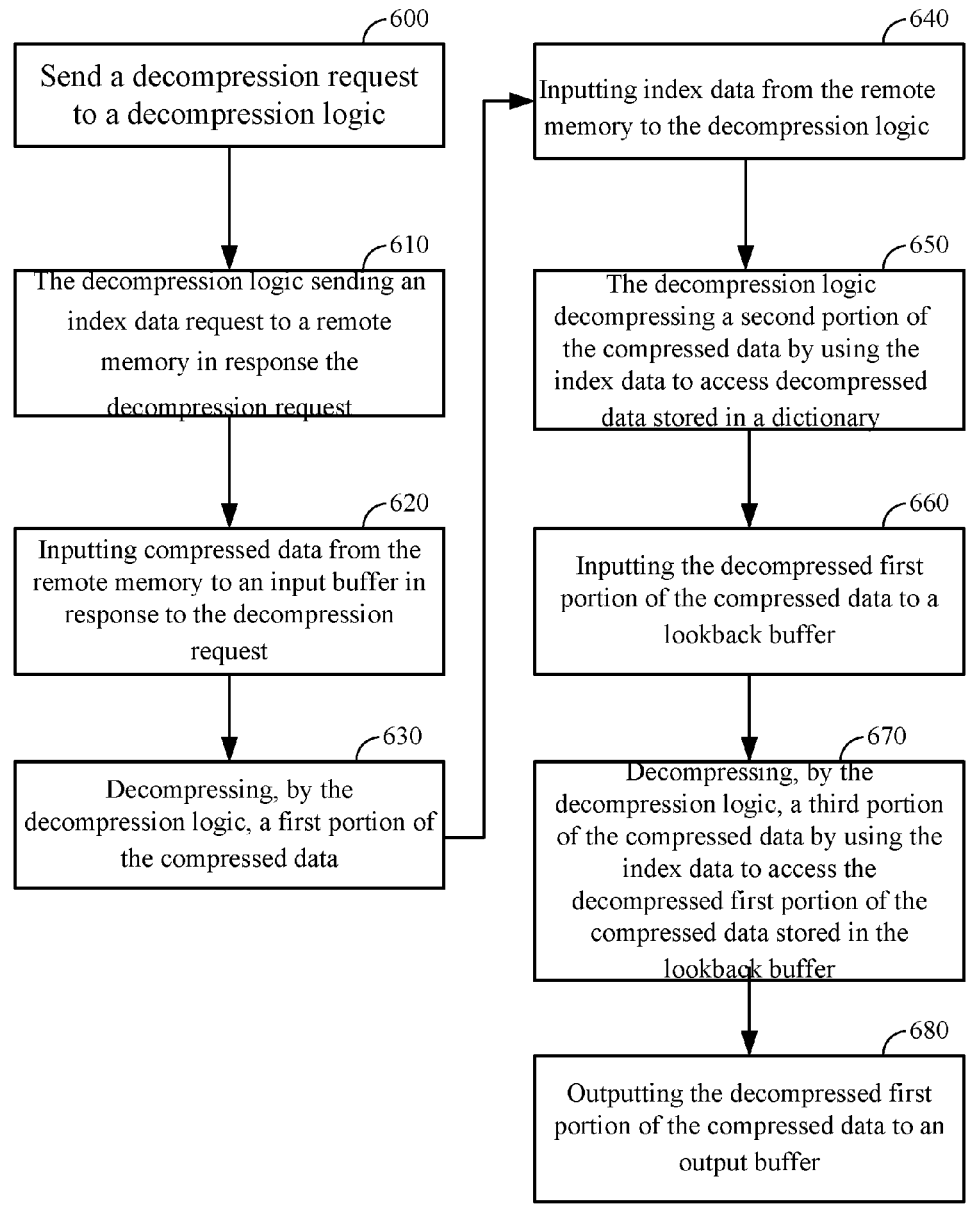
FIG. 5 illustrates an exemplary partial flow of a decompression operation in accordance with some examples of the disclosure.

FIG. 5 illustrates an exemplary partial flow of a decompression operation in accordance with any of the system, devices, or apparatus described above. As shown in FIG. 5, the partial process flow begins in 600 with sending a decompression request to a decompression logic. In 610, the decompression logic sends an index data request to a remote memory in response the decompression request. In 620, the partial process flow continues with inputting compressed data from the remote memory to an input buffer in response to the decompression request, such as input buffer 332 or 532. In 630, the decompression logic decompresses a first portion of the compressed data. In 640, the process continues with inputting index data from the remote memory to the decompression logic. In 650, the decompression logic decompresses a second portion of the compressed data by using the index data to access decompressed data stored in a dictionary, such as dictionary 334 or 534. In 660, the process continues with inputting the decompressed first portion of the compressed data to a lookback buffer, such as lookback buffer 335 or 535. In 670, the decompression logic decompresses a third portion of the compressed data by using the index data to access the decompressed first portion of the compressed data stored in the lookback buffer. In 680, the partial process flow ends with outputting the decompressed first portion of the compressed data to an output buffer.

Further, those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The examples described above merely constitute an illustration of the principles of the present disclosure. Modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A system for data decompression, comprising:
   a processor;
   a remote memory that has compressed data, index data, and decode codes stored therein, the remote memory coupled to the processor;
   an input buffer coupled to the processor and the remote memory, the input buffer configured to temporarily store the compressed data from the remote memory;
   an output buffer coupled to the processor and the remote memory, the output buffer configured to temporarily store decompressed data; and
   a decompression logic configured to retrieve a portion of the index data prior to a compressed data request and configured to decompress the compressed data in accordance with the decode codes, the decompression logic being coupled to the input buffer and the output buffer.

2. The system of claim 1, further comprising:
   a first dictionary storing first dictionary data, the first dictionary being coupled to the decompression logic;
   a lookback buffer storing a lookback dictionary, the lookback buffer being coupled to the decompression logic; and
   wherein the decompression logic is configured to retrieve a portion of the first dictionary data from the first dictionary in response to a dictionary decode code and the decompression logic is configured to retrieve a portion of the lookback dictionary from the lookback buffer in response to a lookback decode code.

3. The system of claim 2, further comprising a second dictionary storing second dictionary data and coupled to the decompression logic.

4. The system of claim 3, wherein the first dictionary and the second dictionary are local to the decompression logic.

5. The system of claim 4, wherein the first dictionary data and the second dictionary data are indexed data.

6. The system of claim 5, wherein the first dictionary is a processor cache memory.

7. The system of claim 5, wherein the processor, the remote memory, the input buffer, the output buffer, the first dictionary, the lookback buffer, and the decompression logic are incorporated into a device selected from a group consisting of one of a set top box, a music player, a video player, an entertainment unit, a navigation device, a communications device, a personal digital assistant (PDA), a fixed location data unit, and a computer, and further including the device.

8. The system of claim 3, wherein the remote memory further comprises:
   a remote dictionary storing remote dictionary data and dictionary index values;
   a remote lookback buffer storing a remote lookback dictionary and lookback index values; and
   wherein the index data includes the dictionary index values and the lookback index values.

9. A method of decompressing data, the method comprising:
   sending, by a decompression logic, a first index data request to a remote memory;
   sending a compressed data request to the decompression logic after sending the first index data request;
   sending, by the decompression logic, a second index data request to the remote memory in response the compressed data request;
   inputting compressed data from the remote memory to an input buffer in response to the compressed data request;
   decompressing, by the decompression logic, a first portion of the compressed data;
   inputting index data from the remote memory to the decompression logic; and
   decompressing, by the decompression logic, a second portion of the compressed data by using the index data to access decompressed data stored in a local dictionary.

10. The method of claim 9, further comprising inputting the decompressed first portion of the compressed data to a local lookback buffer.

11. The method of claim 10, further comprising decompressing, by the decompression logic, a third portion of the compressed data by using the index data to access the decompressed first portion of the compressed data stored in the local lookback buffer.

12. The method of claim 11, further comprising outputting the decompressed first portion of the compressed data to an output buffer.

13. The method of claim 12, wherein the local dictionary is a processor cache memory and the decompression logic resides in a processor coupled to the processor cache memory.

14. The method of claim 13, wherein the local lookback buffer stores the index data and is coupled to the output buffer.

15. A non-transitory computer-readable storage medium comprising instructions that, when executed by a processor, cause the processor to:
   send, by a decompression logic, a first index data request to a remote memory;
   send a compressed data request to the decompression logic after the first index data request is sent;

send, by the decompression logic, a second index data request to the remote memory in response the compressed data request;
input compressed data from the remote memory to an input buffer in response to the compressed data request;
decompress, by the decompression logic, a first portion of the compressed data;
input index data from the remote memory to the decompression logic; and
decompress, by the decompression logic, a second portion of the compressed data by use of the index data to access decompressed data stored in a local dictionary.

16. The non-transitory computer-readable storage medium of claim 15, further comprising instructions that, when executed by the processor, cause the processor to input the decompressed first portion of the compressed data to a local lookback buffer.

17. The non-transitory computer-readable storage medium of claim 16, further comprising instructions that, when executed by the processor, cause the processor to decompress, by the decompression logic, a third portion of the compressed data by using the index data to access the decompressed first portion of the compressed data stored in the local lookback buffer.

18. The non-transitory computer-readable storage medium of claim 17, further comprising instructions that, when executed by the processor, cause the processor to output the decompressed first portion of the compressed data to an output buffer.

19. The non-transitory computer-readable storage medium of claim 18, wherein the local dictionary is a processor cache memory and the decompression logic resides in the processor coupled to the processor cache memory.

20. The non-transitory computer-readable storage medium of claim 19, wherein the local lookback buffer stores the index data and is coupled to the output buffer.

* * * * *